United States Patent
Vasquez et al.

(10) Patent No.: US 11,329,217 B2
(45) Date of Patent: May 10, 2022

(54) METHOD FOR MANUFACTURING A MAGNETIC RANDOM-ACCESS MEMORY DEVICE USING POST PILLAR FORMATION ANNEALING

(71) Applicant: Integrated Silicon Solution, (Cayman) Inc., Grand Cayman (KY)

(72) Inventors: Jorge Vasquez, San Jose, CA (US); Bartlomiej Adam Kardasz, Pleasanton, CA (US); Jacob Anthony Hernandez, Morgan Hill, CA (US); Thomas D. Boone, San Carlos, CA (US); Georg Wolf, San Francisco, CA (US); Mustafa Pinarbasi, Morgan Hill, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/259,791

(22) Filed: Jan. 28, 2019

(65) Prior Publication Data
US 2020/0243757 A1    Jul. 30, 2020

(51) Int. Cl.
| | |
|---|---|
| *H01L 43/12* | (2006.01) |
| *H01L 27/22* | (2006.01) |
| *H01L 43/02* | (2006.01) |
| *H01L 43/10* | (2006.01) |
| *G11C 11/16* | (2006.01) |
| *H01F 41/32* | (2006.01) |
| *H01F 10/32* | (2006.01) |

(52) U.S. Cl.
CPC ............ *H01L 43/12* (2013.01); *G11C 11/161* (2013.01); *H01F 10/329* (2013.01); *H01F 10/3254* (2013.01); *H01F 10/3286* (2013.01); *H01F 41/32* (2013.01); *H01L 27/22* (2013.01); *H01L 43/02* (2013.01); *H01L 43/10* (2013.01)

(58) Field of Classification Search
CPC ..... H01L 43/12; H01L 2924/00; H01L 43/08; H01L 43/02; H01L 43/10
See application file for complete search history.

(56) References Cited

U.S. PATENT DOCUMENTS

| | | | | |
|---|---|---|---|---|
| 9,425,387 | B1* | 8/2016 | Liu | ................ G11C 11/161 |
| 2017/0125664 | A1* | 5/2017 | Tahmasebi | .............. H01L 43/02 |
| 2018/0331279 | A1* | 11/2018 | Shen | ................... H01L 21/3065 |

* cited by examiner

Primary Examiner — Tony Tran

(57) ABSTRACT

A method for manufacturing a magnetic memory array provides back end of line annealing for associated processing circuitry without causing thermal damage to magnetic memory elements of the magnetic memory array. An array of magnetic memory element pillars is formed on a wafer, and the magnetic memory elements are surrounded by a dielectric isolation material. After the pillars have been formed and surrounded by the dielectric isolation material an annealing process is performed to both anneal the memory element pillars to form a desired grain structure in the memory element pillars and also to perform back end of line thermal processing for circuitry associated with the memory element array.

8 Claims, 10 Drawing Sheets

METHOD FOR MANUFACTURING A MAGNETIC RANDOM-ACCESS MEMORY DEVICE USING POST PILLAR FORMATION ANNEALING

FIELD OF THE INVENTION

The present invention relates to magnetic random-access memory (MRAM) and more particularly to a method for manufacturing a magnetic random-access memory array wherein annealing is performed after memory element pillar definition to increase thermal annealing budget.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer are in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current and such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for manufacturing a memory device. The method includes forming an array of magnetic memory element pillars, dielectric isolation material and circuitry associated with the array of magnetic memory element pillars on a wafer. Then, after forming the array of magnetic memory element pillars, dielectric isolation material and circuitry, a thermal annealing process is performed that is configured to both anneal the magnetic memory element pillars and also perform back end of line thermal processing of the circuitry.

The magnetic memory element pillars can be performed by depositing full film memory element material, forming a mask structure over the full film memory element material and performing a material removal process such as ion beam etching or reactive ion etching. After the pillars have been thus formed, a dielectric isolation material which may include silicon oxide and/or silicon nitride can be deposited and planarized by chemical mechanical polishing.

The method for manufacturing the memory device can be performed without any thermal annealing of the memory element material prior to formation of the memory element pillars. This method advantageously prevents any damage to the memory element pillars (such as damage to the MgO barrier layer or surrounding interface) that might otherwise occur as a result of post pillar process Back End Of Line (BEOL) thermal annealing processes.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
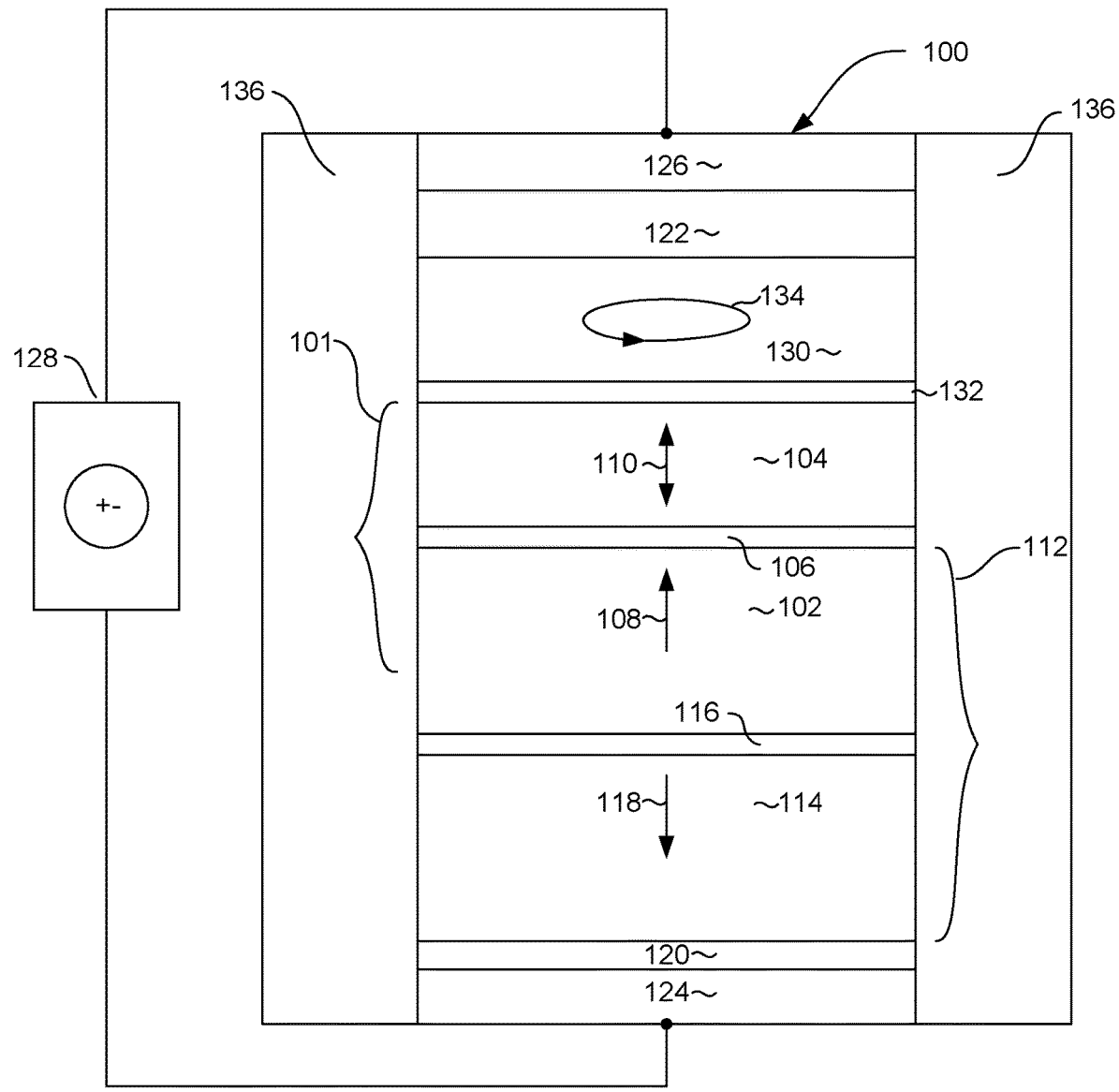
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing and from exposure to ambient atmosphere. Also, electrodes 124, 126 may be provided at the top and bottom of the memory element 100. The electrodes 124, 126 may be constructed of a nonmagnetic, electrically conductive material such as Ta, W, Cu and Al can provide electrical connection with circuitry 128 that can include a current source and can further include circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to pass through the barrier layer 106 to the reference layer 102. As a result, the electrons having an opposite spin will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by a coupling layer 132. The spin polarization layer 130 has a magnetic anisotropy that causes it to have a magnetization 134 with a primary component oriented in the in-plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

The memory element 100, which is shown in side, cross-sectional view in FIG. 1, can be formed in the shape of a pillar, which can be a cylindrical pillar structure and can have an outer side that is surrounded by a dielectric isolation layer 136. The isolation layer 136 can be one or more layers such as an oxide or nitride that provides electrical isolation of the memory element 100 from other adjacent memory elements (not shown) in a magnetic memory array.

The nanofabrication of an array of magnetic memory elements such as the memory element 100 described above involves use of Back End of Line (BEOL) fabrication technology. This fabrication technology includes high temperature annealing processes, at temperatures of around 400 degrees C. for durations of 600 to 100 minutes. This BEOL high temperature process is referred to as post process formation annealing, because it is performed after the formation of the magnetic memory element pillars. This presents a challenge in that the post process annealing can be at a higher temperature than the thermal budget of the magnetic memory element pillars. For example, the high temperature BEOL process can cause changes to the crystalline structure of the barrier layer (106 in FIG. 1), which causes serious degradation of memory element performance such as TMR values, and also negatively affects desired magnetic anisotropies. This has been an ongoing challenge in the manufacture of MRAM arrays since magnetic tunnel junction structures possess a thermal budget that is specific to their design and which cannot be exceeded without suffering serious degradation of TMR and perpendicular magnetic anisotropy of the free layer 104 and reference layer 102. These challenges can be overcome by a process described below that allows post process BEOL annealing to be performed as needed without negatively affecting magnetic element performance.

Figure 2:
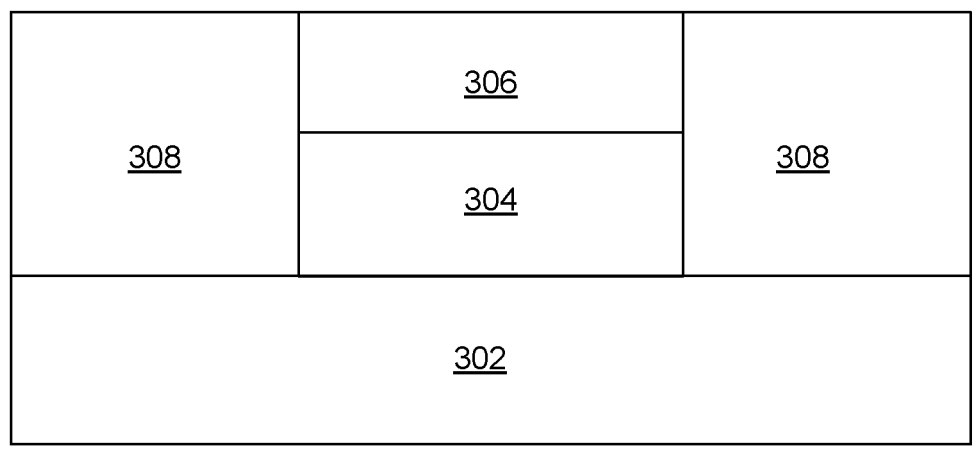
FIGS. 2-6 are side, cross-sectional views of a magnetic memory element in various intermediate stages of manufacture in order to illustrate a method of manufacturing a magnetic memory array according to an embodiment.

FIGS. 2-6 show a portion of a magnetic memory array in various intermediate stages of manufacture in order to illustrate a method of manufacturing a magnetic memory element array according to an embodiment. With particular reference to FIG. 2, a substrate 302 is provided. The substrate can be a semiconductor material and is preferably a monocrystalline silicon (Si) substrate such as a Si wafer. Circuitry 304, such as CMOS circuitry, can be formed on the substrate 302. The circuitry 304 can include a semiconductor material formed over a doped portion of the substrate 302, a gate dielectric and a gate lead structure (not shown in FIG. 3), although other types of circuitry could be used.

An electrically conductive lead 306 can be formed over the CMOS circuitry 304. Also, a dielectric material 308 can be provided at some regions adjacent to the CMOS circuitry 304 and lead layer 306. The top of the lead layer 306 and dielectric layer 308 can be planarized by a process such as chemical mechanical polishing (CMP).

Figure 3:
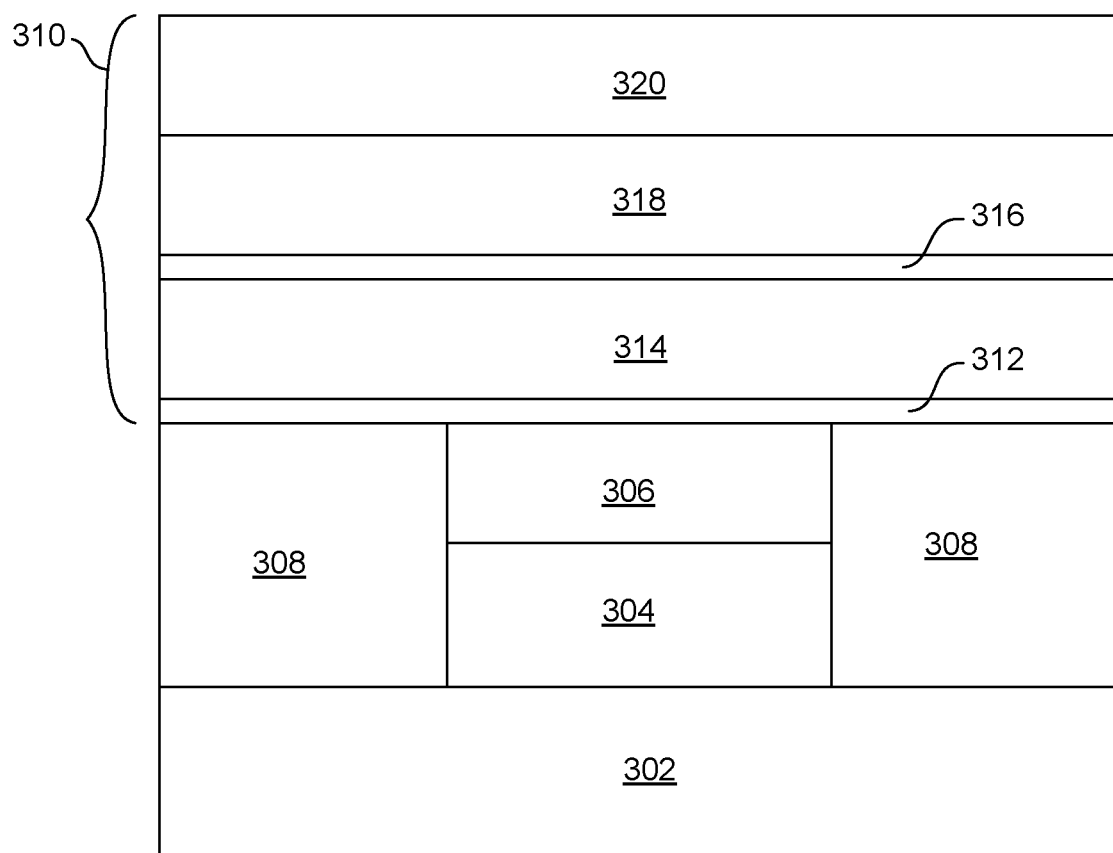

With reference now to FIG. 3, a series of magnetic element layers pMTJ layers 310 are deposited. The (pMTJ) layers 310 can include various layers to make up a magnetic memory element such as the magnetic memory element 100 of FIG. 1. For example, but not by way of limitation, the pMTJ layers 310 can include a seed layer 312, a magnetic reference layer 314, a non-magnetic barrier layer (preferably MgO) 316, a magnetic free layer 318 and a capping layer 320. However, this is by way of illustration, as the series of layers 310 could include other layers as well such as material layer making up the memory element 100 of FIG. 1.

Figure 4:
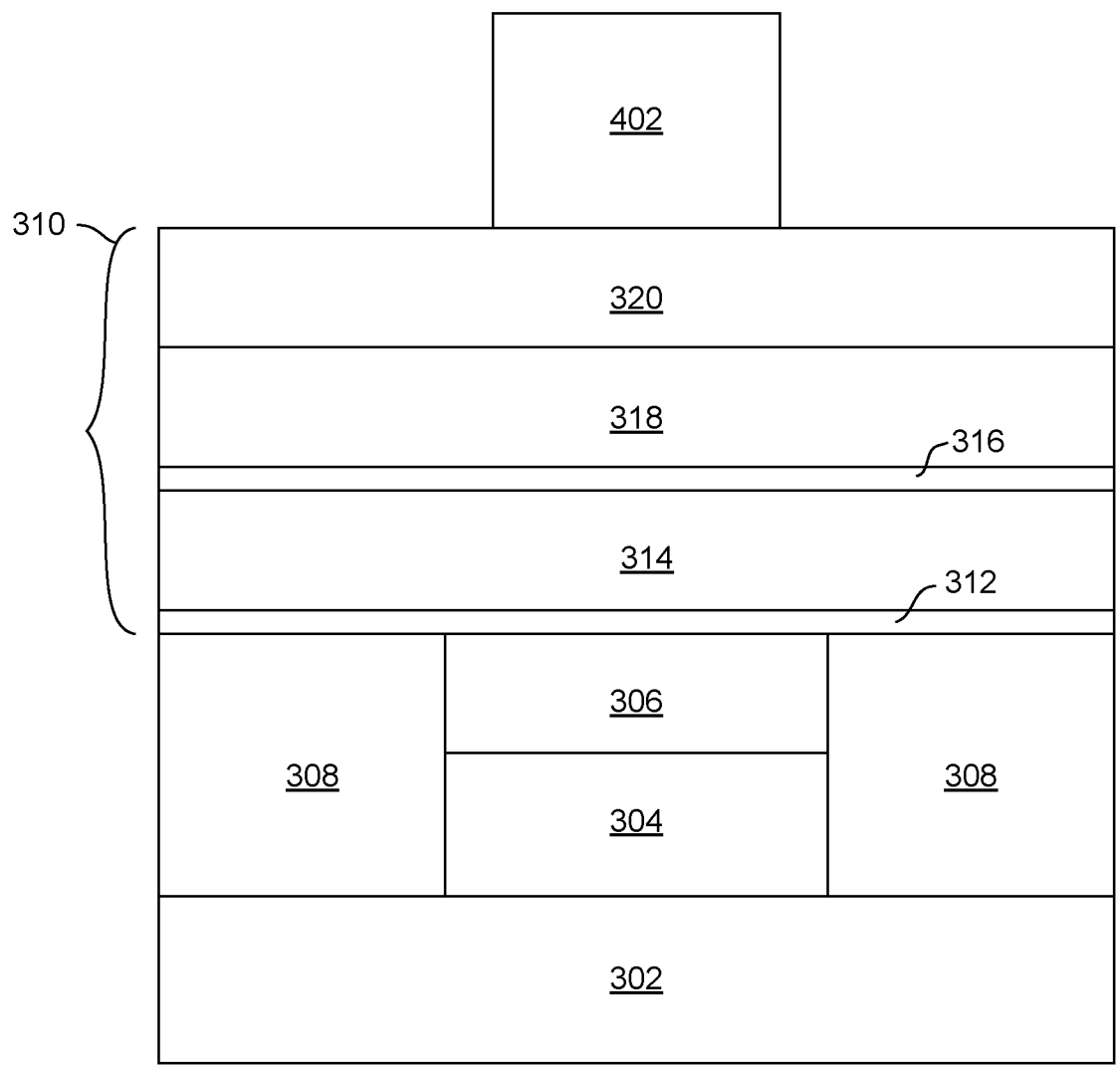

With reference now to FIG. 4, a mask structure 402 is formed over the series of memory element layers 310. The mask structure 402 can include a photoresist mask and an underlying hard-mask layer and may include other layers as well, such as an antireflective coating, adhesion layer, etc. The mask 402 can be formed by depositing a hard mask and spinning on a photoresist material. The photoresist material can then be photolithographically patterned and an etching, such as a reactive ion etching can be performed to transfer the image of the patterned photoresist mask onto the underlying hard mask. The mask 402 is configured to form an array of cylindrical shapes that are configured to define an array of magnetic element pillars. Although only one of such cylindrical mask features is shown in FIG. 4, it should be understood that an array of many thousands of such cylindrical mask features would actually be formed.

Figure 5:
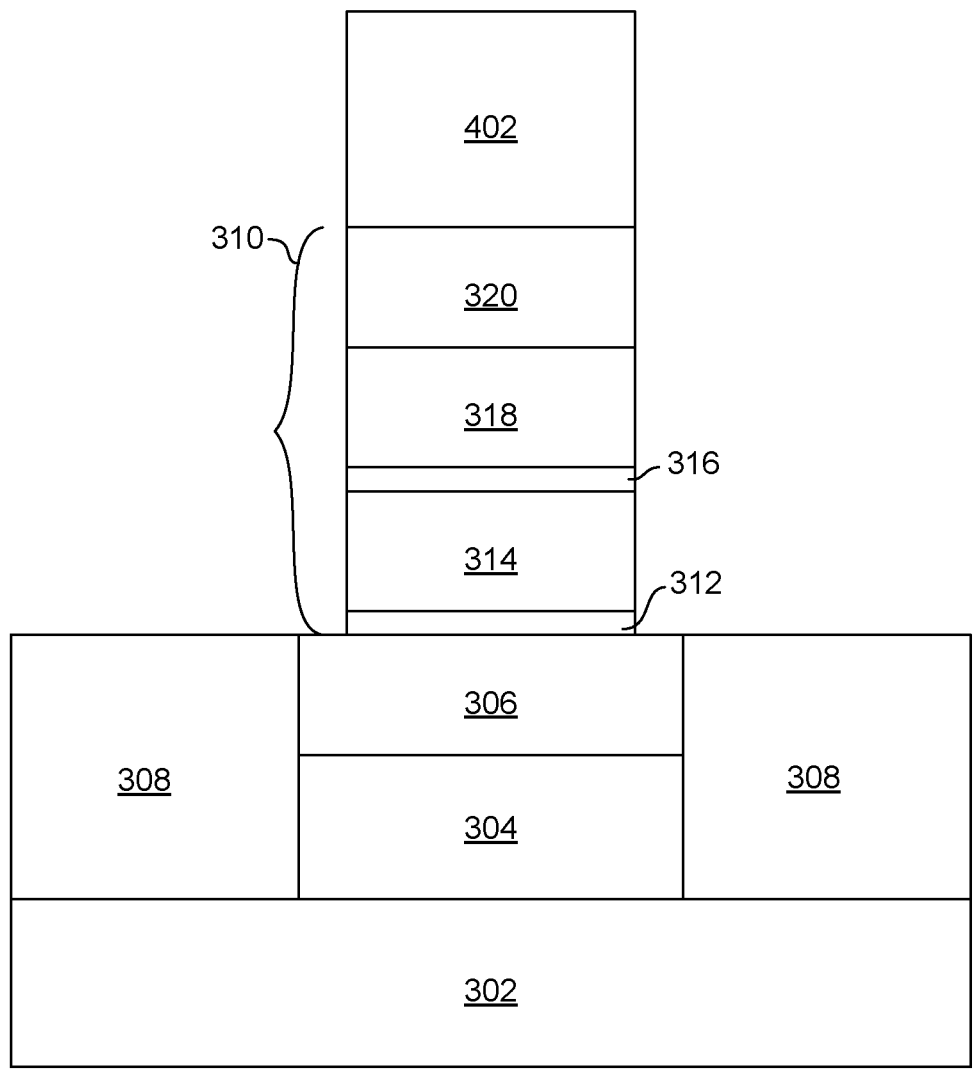

After the mask 402 has been formed, a material removal process such as reactive ion etching, ion milling, etc. is performed to remove portions of the series of memory element layers 310 that are not protected by the mask structure 402 to leave a pattern of memory element pillar structures 310, one of which is shown in cross section in FIG. 5.

It should be pointed out that at this point, no thermal annealing processes have been performed at the full film level after pMTJ layers deposition i.e prior device formation process. Thermal processing, such as to ensure a desired crystal structure in the barrier layer 316 is not performed prior to forming the memory element pillars as described above.

Figure 6:
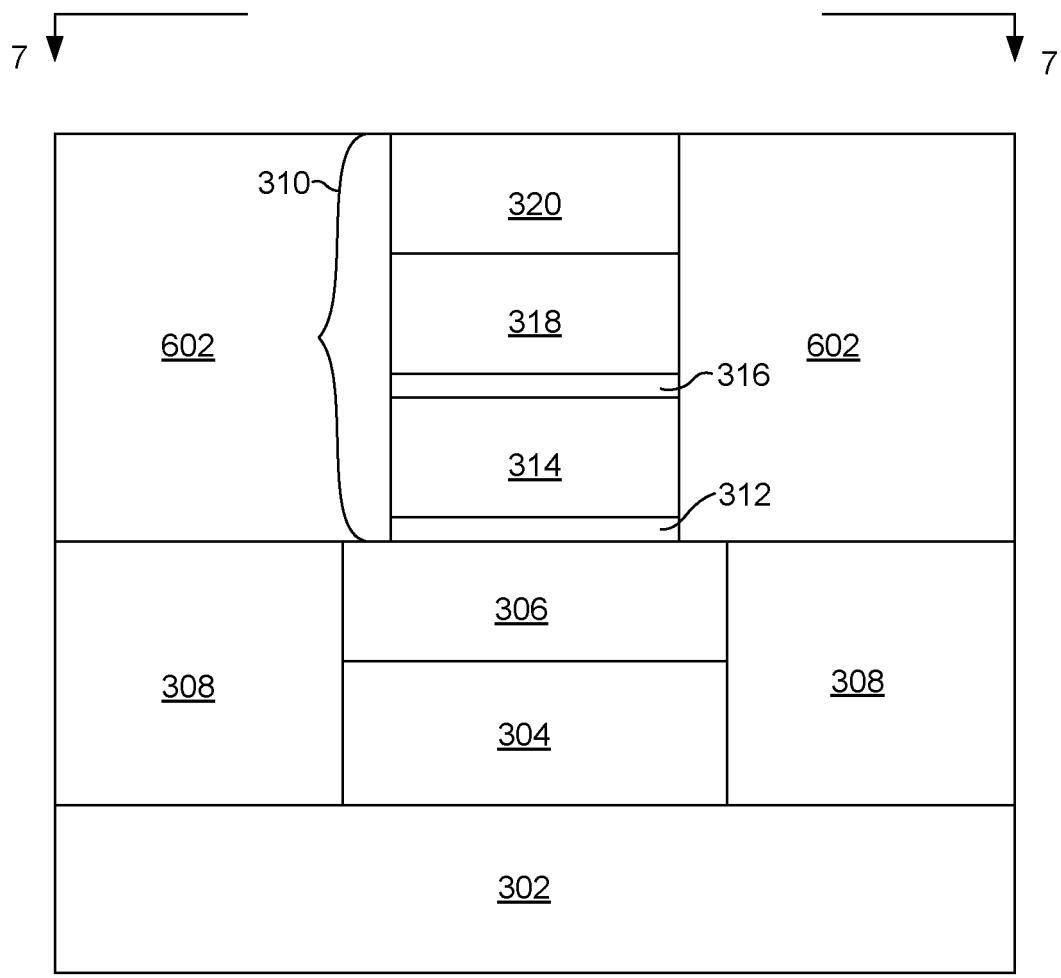
Figure 7:
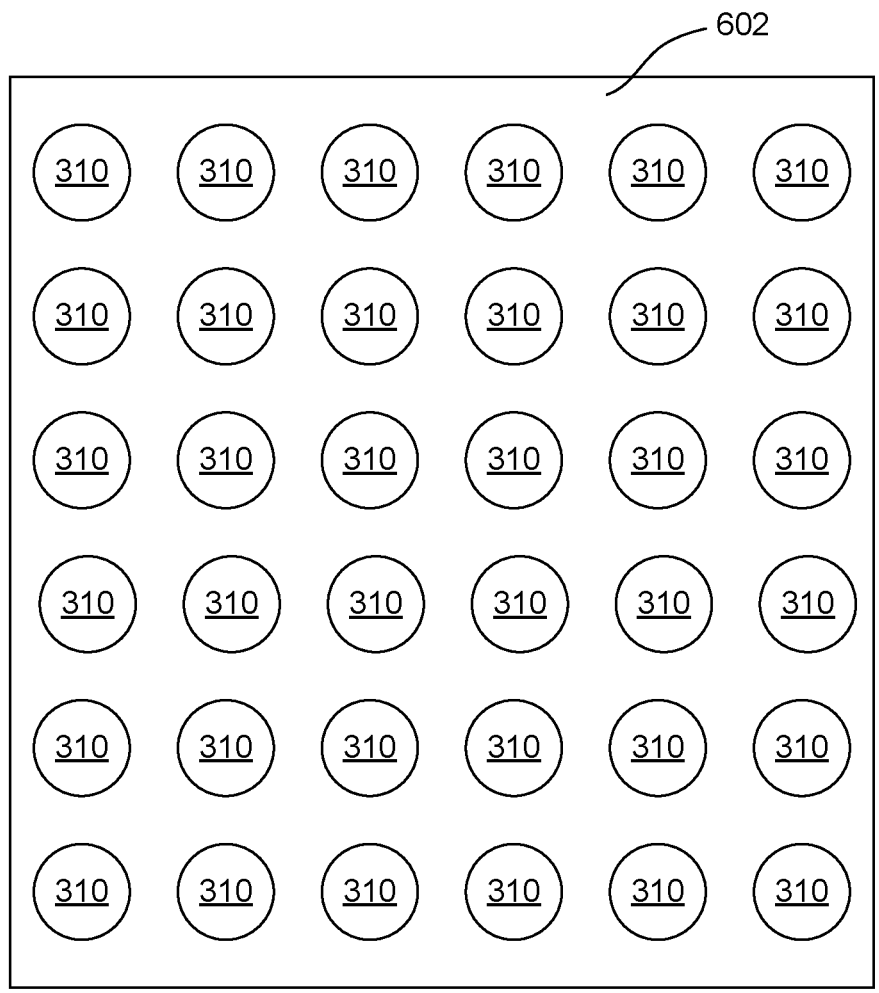
FIG. 7 is a top down view as seen from line 7-7 of FIG. 6 showing an enlarged portion of a magnetic memory array.

After defining the magnetic element pillar structures as described above, a dielectric, non-magnetic isolation layer is deposited and planarized by a process such as chemical mechanical polishing, leaving a structure as shown in FIG. 6. The isolation layer can include one or more layers of Silicon Oxide and Silicon Nitride, which can be deposited by Plasma Vapor Deposition (PVD) sputter deposition, atomic layer deposition (ALD), chemical vapor deposition (CVD), etc. It should be understood, that while FIG. 6 shows a side cross-sectional view of a magnetic memory element pillar 310 embedded in a surrounding dielectric isolation layer 602, there would actually be many thousands of such memory element pillars formed. FIG. 7 shows a top-down view of a slightly larger area as seen from line 7-7 of FIG. 6, wherein it can be seen that an array of cylindrical pillar structures 310 are formed in the dielectric isolation layer 602.

Figure 8:
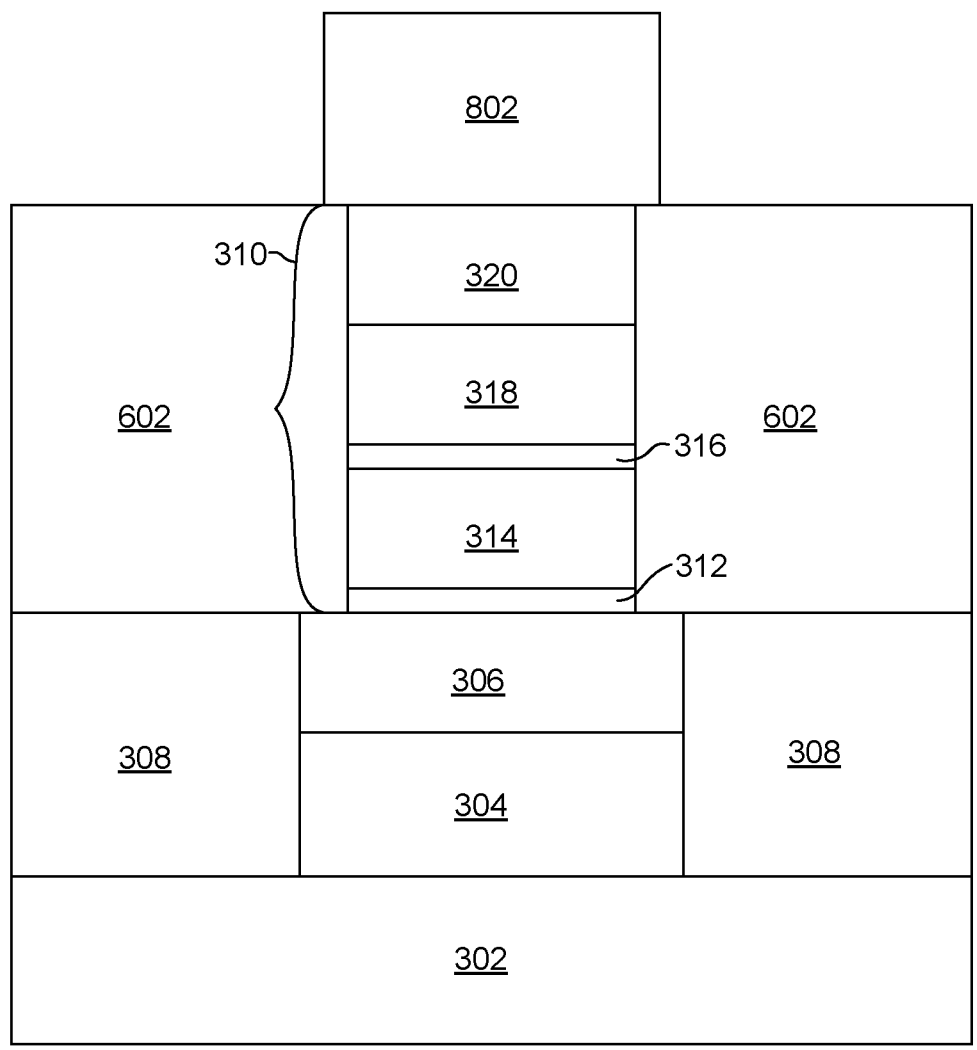
FIG. 8 is a cross-sectional view of a magnetic memory element with an upper lead formed thereover.

With reference now to FIG. 8, a top lead 802 is formed over the top of the memory element 310. The top lead 802 can be formed as an electrically conductive lead line that could extend into and out of the plane of the page in FIG. 8 to contact multiple memory element pillars.

After the memory element pillars 310, surrounding isolation layer 602, and lead 802 have been formed as described above, a novel thermal annealing process is performed that serves to both anneal memory element pillars (such as to form a desired crystalline structure in the barrier layer 106 (FIG. 1)) and also to also provide Back End Of Line (BEOL) thermal processing for properly treating circuitry connected with the memory element pillars for reading and writing data to the memory element pillars 310.

The post pillar formation annealing process can consist of annealing the wafer as a last step of the BEOL CMOS process. After forming the magnetic pillar elements 310 and forming the surrounding dielectric isolation material 602 on a wafer, the wafer is inserted into a vacuum annealing oven. Then, the temperature is raised from about 25 degrees C. to about 400 degrees C. (e.g. 350-450 degrees C.) within a period of about 40 minutes (e.g. 30-50 minutes). The wafer is kept at this constant temperature for about another 60 minutes (e.g. 40-100 minutes) in a vacuum of at least $1\times10^{-4}$ Torr Then, the wafer is cooled to about 120 degrees C. (e.g. 100-140 degrees C.) within a period of about 40 minutes (e.g. 30-50 minutes) at a vacuum of at least $1\times10^{-4}$ Torr. A final cooling step can be performed in an $N_2$ atmosphere to cool the wafer from about 120 degrees C. to about 40 degrees C. (e.g. 30-50 degrees C.) in a period of about 20 minutes (e.g. 10-30 minutes). The presence of the $N_2$ atmosphere can be beneficial in reducing the cool-down time. Another method of post pillar annealing process can include so called Rapid Thermal Annealing (RTA). In this method the temperature rise to about 400 degrees C. and cooling to room temperature of the wafer is achieved in less than 60 seconds in the annealing oven at a vacuum at least $1\times10^{-4}$ Torr. RTA method reduces significantly temperature ramp up and cool down time without reducing the constant temperature time (soak time). RTA annealing process may be advantageous in certain applications of post pillar formation annealing process required by the BEOL CMOS technology.

The various temperatures and time of annealing can be varied depending on the design of the memory element pillars 310 and associated circuitry. For instance, Boron rich CoFeB alloys (which may be employed in one or more of the layers 114, 102, 104 (FIG. 1) or thicker free and/or reference layers 104, 102 may require higher annealing temperatures or longer annealing time due to the higher Boron concentration to achieve optimum tunneling magnetoresistance (TMR) and area resistance (RA) values.

Use of the above described post pillar formation annealing process advantageously allows for high TMR and also thermal stability (PMA) improvement without the need to anneal the memory element structure on the thin film level (i.e. before pillar formation). This process results in no shunting of the memory devices 310, thereby producing high yields. The process achieves desired MgO barrier layer 106 crystallization and proper interface formation of the MTJ junction (i.e. interface between barrier layer 106 and reference and free layers 102, 104).

Figure 9:
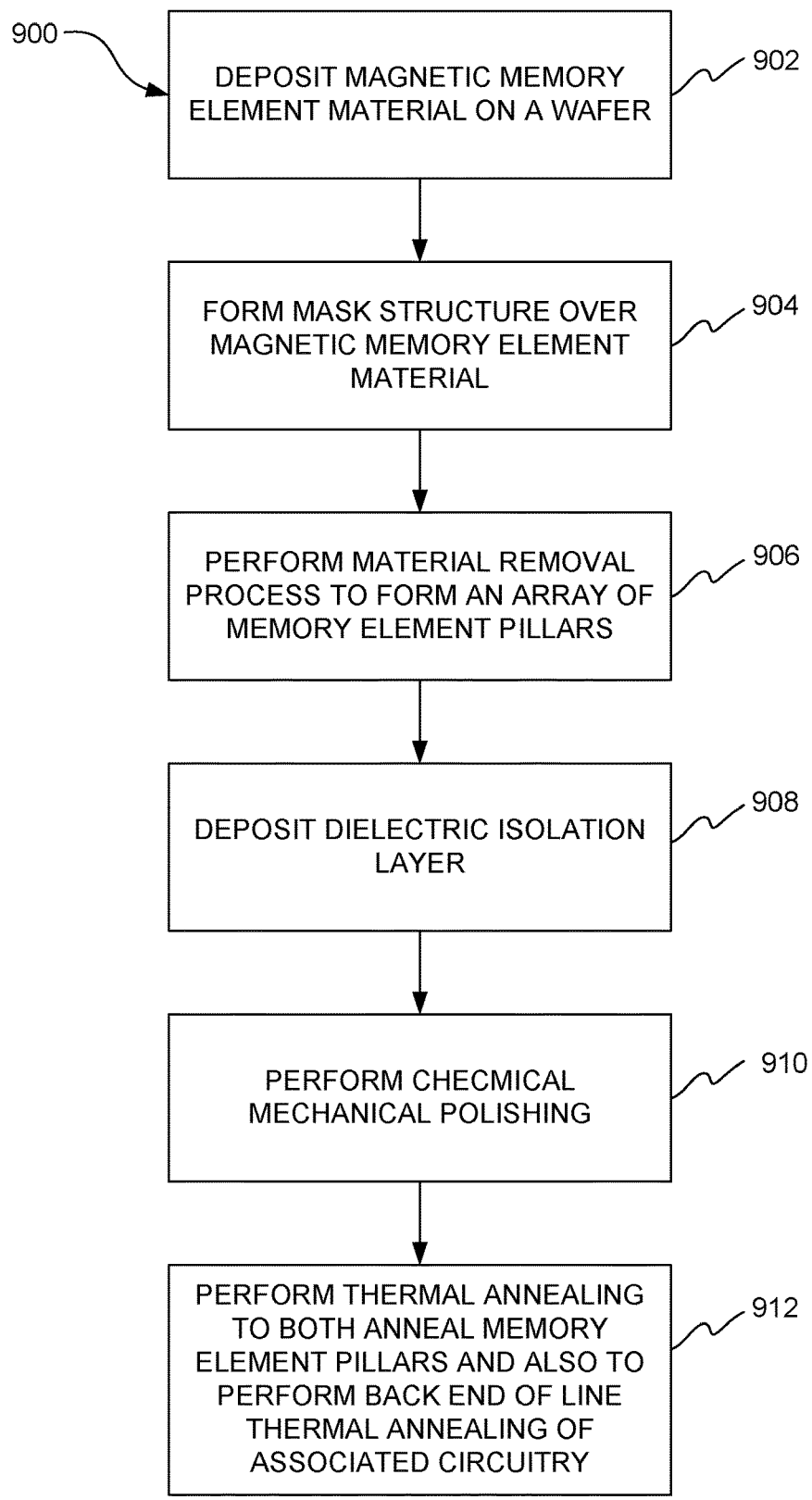
FIG. 9 is a flowchart illustrating a method for manufacturing an array of magnetic memory elements for use in a magnetic random-access data recording system.

The above described process can be summarized with reference to FIG. 9, which shows a flowchart illustrating a process 900 for forming a magnetic data recording device. The process 900 begins with a step 902 of depositing magnetic memory element material on a wafer. The magnetic memory element material can include a non-magnetic barrier layer such as MgO located between first and second magnetic layers, and may include other material layers as well. Then, in a step 904, a mask is formed over the magnetic memory element material. The mask can be configured to define an array of magnetic memory element pillars. Then, in a step 906, a material removal process such as ion beam etching or reactive ion etching can be performed to remove portions of the magnetic memory element material that are not protected by the mask so as to define a series of magnetic memory element pillars. Then, in a step 908 a dielectric isolation layer material is deposited. This material can be one or more layers of a material such as silicon oxide and/or silicon nitride. Then, in a step 910 a chemical mechanical polishing process is performed to planarize the deposited dielectric material. Then, in a step 912, a thermal annealing process is performed. The thermal annealing process is performed in such a manner so as to both (1) thermally anneal the memory element pillars to provide a desired grain structure in the memory element pillars, especially with regard to the barrier layer (e.g. MgO), and also (2) to provide back end of line thermal processing for circuitry associated with the memory element pillars, which associated circuity can before and/or after formation of the magnetic memory element pillars.

Figure 10:
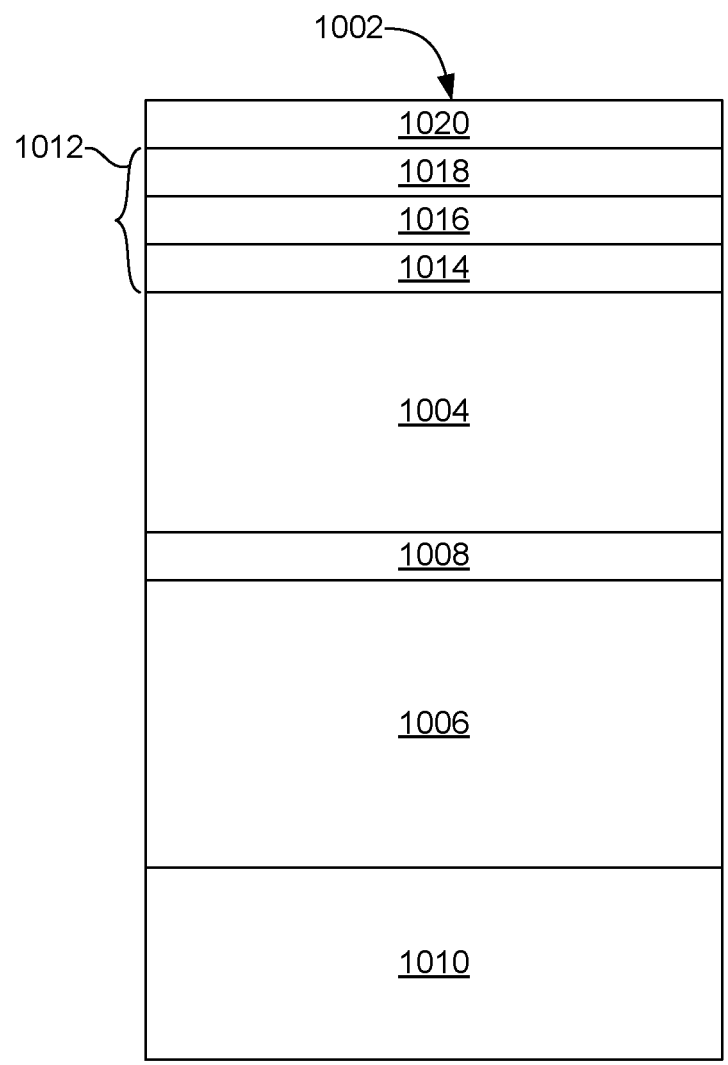
FIG. 10 is a schematic, cross sectional view of a perpendicular magnetic tunnel junction (pMTJ) element, according to an embodiment.

FIG. 10 shows a cross-sectional, schematic view of a magnetic memory element according to an embodiment to help illustrate some of the advantages provided by the above described process. With reference to FIG. 10, a magnetic memory element 1002 includes a magnetic free layer 1004, a magnetic reference layer 1006 and a non-magnetic barrier layer 1008 located between the magnetic free layer 1004 and the magnetic reference layer 1006. The barrier layer 1008 is preferably constructed of magnesium oxide (MgO). As with the embodiment described above with reference to FIG. 1, the magnetic free layer 1004 has a magnetization that is stable in one of two magnetic states perpendicular to the plane of the layer 1002, but which is free to move between these two perpendicular states. The magnetic reference layer 1006 has a magnetization that is pinned in a direction perpendicular to the plane of the layer 1006. A seed layer 1010 may be provided at the bottom of the memory element 1002 to ensure a desired crystalline structure in the layers deposited thereover, and a magnetic capping layer 1012 is formed at the top of the magnetic element 1002 over the magnetic free layer 1002. The memory element 1002 may include other layers as well such as, but not limited to, the layers of the magnetic memory element 100 of FIG. 1. The capping layer 1012 can be formed as a multi-layer structure, having a layer of magnesium oxide (MgO) 1014 formed over the magnetic free layer 1004. A layer of Ru 1016, which can have a thickness of, for example, 1-4 nm can be formed over the MgO layer 1014, and a layer of Ta 1018 which can have a thickness of, for example, 2-5 nm can be formed over the layer of Ru 1016. A hard mask layer 1020 can be formed over the capping layer 1012, and can be formed of a material such as Ru, Ta, Ti, W etc., and can have a thickness of 10-70 nm.

The design of a pMTJ device stack is specific to the particular MRAM application. For example, in a particular design of the pMTJ device, the MgO capping layer 1014 formed on top of the free layer 1004 provides improved perpendicular magnetic anisotropy (PMA) in the free layer 1004.

The resistivity of the device 1002, which influences switching voltage, is sensitive to the Post Pillar Annealing process. Since the overall resistivity of the device 1002 is predominantly determined by the thickness of the MgO layers in the pMTJ stack (e.g. barrier layer 1008 and capping layer 1014) the area resistance (RA) product of the MgO main barrier of a tunnel junction 1008 needs to be in particular ratio with respect to the MgO capping layer 1014. The ratio of the RA product of MgO main barrier 1008 to the RA product of MgO capping layer 1014 can be chosen specifically for the MRAM product application. For instance, RA ratios (Ra-barrier/Ra-cap) of ~1-3 will lead to higher free layer thermal stability which improves data retention and breakdown voltage. High thermal stability and endurance is required in non-volatile Memory class (NVM) MRAM application and for use in high temperature applications such as automotive applications which can require operation at up to 150 degrees C. At the same time, the switching current and switching voltage may be increased due to thicker MgO barrier 1008 and capping layer 1014. As an example, the MgO main barrier layer 1008 can be chosen to have an RA=8 $\Omega\mu m^2$ with MgO cap RA=4 $\Omega\mu m^2$.

On the other hand, higher RA ratios of 4-16 will lead to a decrease in the resistivity of the device 1002 during post pillar annealing process. Therefore, higher RA ratio (Ra- Barrier/Ra-Cap) devices can be used for MRAM application where low switching current and switching voltage is necessary, such as in SRAM applications. At the same time, thermal stability can be lower compared to devices with RA ratio 1-3. As an example, for SRAM application MgO main barrier can be chosen to be RA=4 $\Omega\mu m^2$ with MgO cap RA=1.0 $\Omega\mu m^2$.

Therefore, the performance parameters of the magnetic element 1002 can be controlled by controlling the ratio of barrier layer area resistance to cap layer area resistance (RA barrier/RA cap). A higher (RA barrier/RA cap) ratio allows for higher thermal stability of the pMTJ device 1002 when used with the above described post pillar annealing process. On the other hand, a lower (RA barrier/RA cap) ratio allows for lower switching current and switching voltage of the pMTJ device 1002 when used with the above described post pillar annealing process.

In both cases, post pillar annealing process is required for CMOS BEOL process but the choice of the MgO main barrier 1008 RA and MgO capping layer 1014 RA for the design of devices would ultimately determine the function of the MRAM device and its particular product application. Therefore, the Post Pillar Annealing process can be universally implemented in CMOS BEOL process for different MRAM product applications but it also requires adjustments to the RA of MgO main barrier and MgO capping layer of the pMTJ device.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A method for manufacturing a magnetic memory device, the method comprising:
    forming CMOS circuitry;
    after forming the CMOS circuitry, depositing a series of magnetic memory element layers, the series of magnetic memory element layers including a non-magnetic barrier layer located between first and second magnetic layers;
    forming a mask structure over the series of magnetic memory element layers, the mask structure being configured to define an array of memory element pillars;
    performing a material removal process to remove portions of the series of magnetic memory layers that are not protected by the mask structure to form an array of pillars;
    depositing a dielectric isolation layer around the formed array of pillars by depositing a dielectric isolation material in space where the portions of the series of magnetic memory layers are removed; and
    after performing the material removal process and after depositing the dielectric isolation layer, performing a thermal annealing process that is configured to simultaneously anneal the non-magnetic barrier layer to form a desired grain structure in the non-magnetic barrier layer and also to perform back end of line annealing for the CMOS circuitry,
    wherein the series of magnetic memory element layers and the dielectric isolation material are deposited over a wafer, and wherein the thermal annealing process further comprises raising the wafer to a temperature of 350 degrees C. to 450 degrees C. within a period of 30-50 minutes and maintaining the wafer at that temperature for a duration of about 40-100 minutes.

2. The method as in claim 1, wherein no thermal annealing is performed prior to performing the material removal process and depositing the dielectric isolation material.

3. The method as in claim 1, wherein raising the wafer to a temperature of 350 degrees C. to 450 degrees C. comprises heating the wafer to a temperature of about 400 degrees C.

4. The method as in claim 1, wherein raising the wafer to a temperature of 350 degrees C. to 450 degrees C. within a period of 30-50 minutes and maintaining the wafer at that temperature for a duration of about 40-100 minutes comprises raising the wafer to a temperature of about 400 degrees C. within a period of about 40 minutes and maintaining the wafer at that temperature for a duration of about 60 minutes.

5. The method as in claim 1, wherein maintaining the wafer at that temperature for a duration of about 40-100 minutes comprises maintaining that temperature for a duration of about 100 minutes.

6. The method as in claim 1, wherein raising the wafer to a temperature of 350 degrees C. to 450 degrees C. within a period of 30-50 minutes and maintaining the wafer at that temperature for a duration of about 40-100 minutes comprises heating the wafer to a temperature of about 400 degrees C. for a duration of about 60 minutes in a vacuum.

7. The method as in claim 1, wherein raising the wafer to a temperature of 350 degrees C. to 450 degrees C. within a period of 30-50 minutes and maintaining the wafer at that temperature for a duration of about 40-100 minutes comprises heating the wafer to a temperature of about 400 degrees C. for a duration of about 60 minutes in a vacuum of about $1\times10^{-4}$ Torr.

8. The method as in claim 1, wherein:
    the non-magnetic barrier layer comprises MgO; and
    the series of magnetic element layers further comprise a cap layer that includes MgO, and wherein the barrier layer and cap layer are configured to define a resistance ratio (RA barrier/RA cap) that allows for desired performance parameters to be met.

* * * * *